(12) United States Patent
Liu et al.

(10) Patent No.: US 9,543,970 B2
(45) Date of Patent: Jan. 10, 2017

(54) CIRCUIT FOR DIGITIZING PHASE DIFFERENCES, PLL CIRCUIT AND METHOD FOR THE SAME

(71) Applicant: TAIWAN SEMICONDUCTOR MANUFACTURING COMPANY LTD., Hsinchu (TW)

(72) Inventors: Chih-Min Liu, Hsinchu County (TW); Chin-Hao Chang, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/690,085

(22) Filed: Apr. 17, 2015

(65) Prior Publication Data

US 2016/0308541 A1 Oct. 20, 2016

(51) Int. Cl.
*H03L 7/06* (2006.01)
*H03L 7/099* (2006.01)
*H03L 7/089* (2006.01)

(52) U.S. Cl.
CPC .............. *H03L 7/0992* (2013.01); *H03L 7/089* (2013.01)

(58) Field of Classification Search
USPC .............. 327/2–12, 105–123, 141, 144–163; 331/1 A, 15–17; 375/373–376
See application file for complete search history.

(56) References Cited

U.S. PATENT DOCUMENTS

| | | | | |
|---|---|---|---|---|
| 2002/0084815 A1* | 7/2002 | Murphy | ............... | H03L 7/0891 327/157 |
| 2003/0117195 A1* | 6/2003 | Chang | ..................... | H03L 7/081 327/159 |
| 2004/0223575 A1* | 11/2004 | Meltzer | ............... | H03D 13/003 375/376 |
| 2007/0075785 A1* | 4/2007 | Kossel | ................... | H03L 7/089 331/16 |

* cited by examiner

*Primary Examiner* — Brandon S Cole
(74) *Attorney, Agent, or Firm* — WPAT, P.C., Intellectual Property Attorneys; Anthony King

(57) ABSTRACT

A phase-locked loop (PLL) circuit is disclosed. The PLL circuit includes a detecting circuit configured to detect a phase difference between a digitally controlled oscillator (DCO) clock signal and a reference clock signal, and generate a difference signal based on the detected phase difference; a digitized difference generator, coupled to the detecting circuit, configured to generate a control code based upon the difference signal; and a DCO configured to generate the DCO output signal responsive to the control code of the digitized difference generator; wherein the detecting circuit, the digitized difference generator and the DCO form a closed loop and reduce the phase difference between the DCO output signal and the reference clock signal. An associated method and a circuit are also disclosed.

19 Claims, 15 Drawing Sheets

| Binary code | Thermometer code |
|---|---|
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

Figure 11

CIRCUIT FOR DIGITIZING PHASE DIFFERENCES, PLL CIRCUIT AND METHOD FOR THE SAME

BACKGROUND

In advanced high density semiconductor manufacturing processes, the number of capacitors and resistors is suggested to be reduced. As such, digital phase-locked loop (DPLL) circuits or all digital phase-locked loop (ADPLL) circuits are employed to replace analog phase-locked loop circuits for suitable applications because analog phase-locked loop circuits often require more capacitors and resistors than DPLL or ADPLL circuits. An ADPLL circuit may include a digital phase detector (also known as a digital phase comparator) to detect phase differences between a digitally controlled oscillator (DCO) signal and a reference clock signal. The digital phase detector generates a control signal to the DCO for adjustment in response to the detected phase differences. As a result, skew between the DCO signal and the reference clock signal can be eliminated in the closed loop.

Some existing ADPLL or DPLL circuits such as a Time-to-Digital Converter (TDC) based DPLL circuit are complicated in architecture and typically consume more power than PLL circuits in order to achieve high accuracy. PLL circuits that employ bang-bang phase detector (BBPD) may be easy to design and is simpler than the TDC based PLL circuits, but unfortunately the associated application is limited due to poor jitter performance of BBPD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4-1 is a diagram illustrating an internal logic and a truth table of a D-type latch according to an aspect of the present disclosure;

FIG. 4-2 is a diagram illustrating an internal logic and a truth table of a D-type latch according to another aspect of the present disclosure;

FIG. 11 is an exemplary conversion table of thermometer code to the binary code used by converters in FIG. 10;

DETAILED DESCRIPTION

Figure 1:
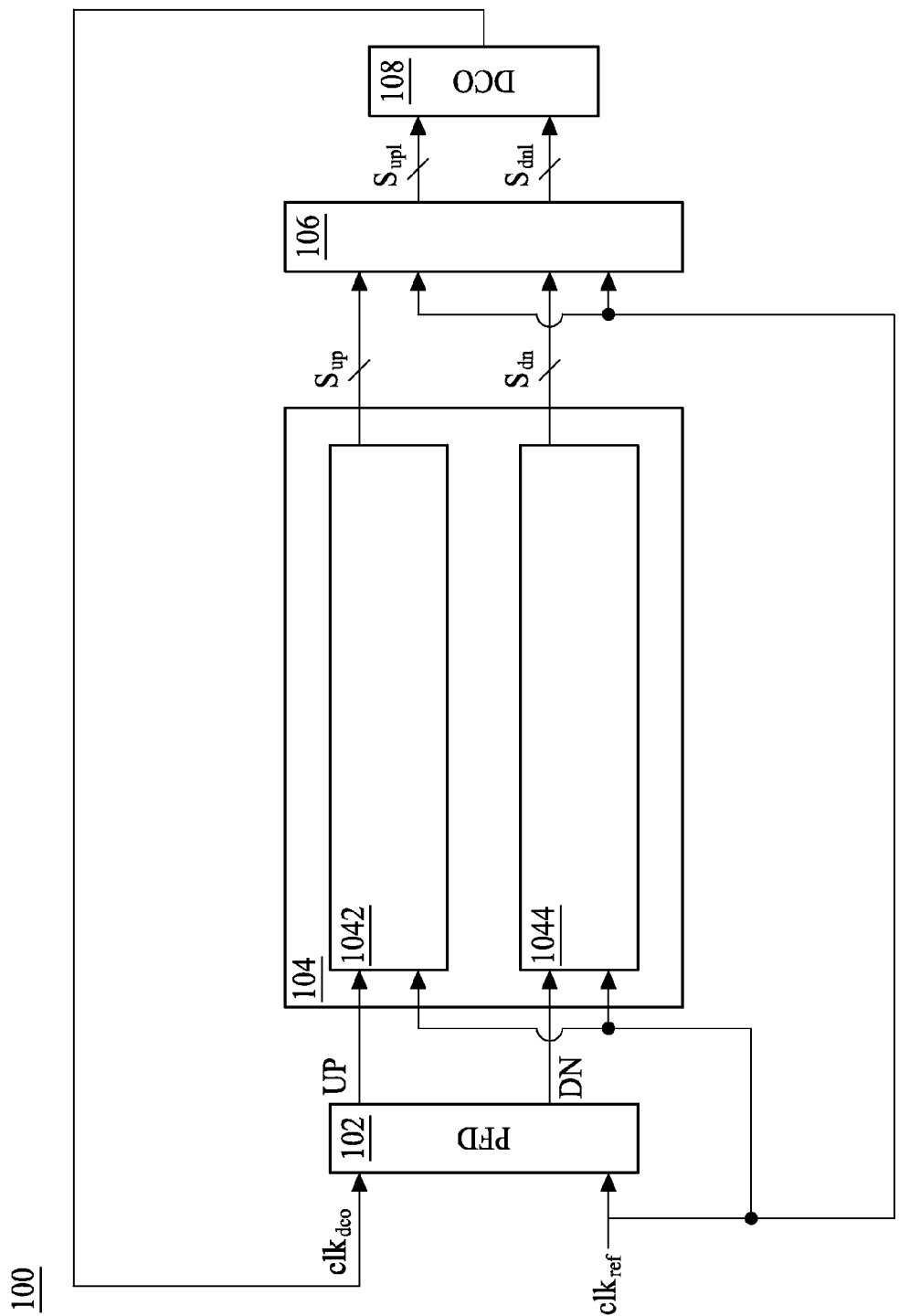
FIG. 1 is a diagram illustrating a PLL circuit according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Some embodiments have one or a combination of the following features and/or advantages. The disclosure, in various embodiments, is pertinent to a digitized architecture of PLL. In some embodiments, the PLL circuit includes a phase detector configured to generate a phase difference signal representing phase differences between a DCO output signal and a reference clock signal, a digitized phase difference generator configured to generate a control code based on a pulse width of a pulse of the phase difference signal, and a DCO configured to generate the DCO output signal with a phase adjusted corresponding to the control code. In some embodiments, the digitized phase difference generator include a latch chain configured to generate the control code by propagating a starting edge of the pulse arrived at the latch chain and stop propagating the starting edge in response to an ending edge of the pulse. In some embodiments, a number of stages of the latch chain and a delay of each stage are controlled such that a latency of the phase difference generator is within one half of a cycle of the reference clock signal and the PLL circuit is capable of measuring an adequate range of the phase differences with an appropriate resolution. The other half of the cycle is available to other blocks for improving, for example, the locking ability of the PLL circuit. Therefore, a loop delay of the PLL circuit is reduced and the number of stages of the latch chain is controlled, thereby decreasing circuit dimension and power consumption of the PLL circuit. Further, in some embodiments, the starting edge arrived at the latch chain is delayed to improve accuracy in measuring the pulse width of the pulse and increasing a representation capacity of the latch chain.

In various embodiments related to the digitized architecture of PLL, phase adjustment can be performed in high resolution with reduced loop delay. The digitized architecture of PLL is capable of performing phase locking and frequency locking at the same time in a specified frequency locking range. At the same time, the proposed architecture has latch chains in a reasonable stage number, therefore the loop delay, circuit layout dimension and power consumption of the digitized architecture of PLL can be reduced. Concepts of the disclosure including the idea of latch chains will be described in greater detail below by several embodiments and associated figures.

Circuit and Operations for Digitized PLL Architecture

FIG. 1 is a diagram illustrating a PLL circuit 100 according to one or more aspects of the present disclosure. FIG. 1 shows an overall structure for the PLL circuit 100 with a digitized PLL architecture. In some embodiments, the PLL circuit 100 is an all digital phase-locked loop (ADPLL) circuit. The term "ADPLL" corresponds to a circuit which employs a DCO which produces an analog clock signal based on digital control codes.

The PLL circuit 100 is a control system that generates a DCO output signal $clk_{dco}$ whose phase is adjusted in relation to a phase of an input reference clock signal $clk_{ref}$. The PLL circuit 100 includes a phase and frequency detector (PFD) 102, a digitized phase difference generator 104, a latch stage 106, and a DCO 108. The PFD 102 is operative to receive the DCO output signal $clk_{dco}$ and the reference clock signal $clk_{ref}$, compare the phase of the DCO output signal $clk_{dco}$ with the phase of the reference clock signal $clk_{ref}$ and produce a phase difference signal. The phase difference signal includes a pair of signals, i.e. a signal UP and a signal DN, representing a magnitude and a leading/lagging condition of a phase difference between the DCO output clock signal $clk_{dco}$ and the reference clock signal $clk_{ref}$. The digitized phase difference generator 104 is operative to receive the signals UP and DN and the reference clock signal $clk_{ref}$, and generate a pair of digitized control codes $S_{up}$ and $S_{dn}$ corresponding to the signals UP and DN in response to the reference clock signal $clk_{ref}$. The digitized phase difference generator 104 includes two substantially identical blocks 1042 and 1044 respectively responsible for generating the digitized control code $S_{up}$ corresponding to the signal UP and generating the digitized control code $S_{dn}$ corresponding to the signal DN. The latch stage 106 is operative to latch the control code $S_{up}$ and $S_{dn}$ in response to the reference clock signal $clk_{ref}$ and generate control codes $S_{up1}$ and $S_{dn1}$. The DCO 108 is operative to receive the control codes $S_{up1}$ and $S_{dn1}$ and generate the DCO output signal $clk_{dco}$ of which a phase is adjusted based on the control codes $S_{up1}$ and $S_{dn1}$. A feedback loop brings the output signal $clk_{dco}$ of the DCO 108 back to the PFD 102 for comparison with the reference clock signal $clk_{ref}$ and forms a closed loop as shown in FIG. 1. In this way, the PLL circuit 100 is capable of eliminating skew between the DCO output signal $clk_{dco}$ and the reference clock signal $clk_{ref}$. The phase of the DCO output signal $clk_{dco}$ of the PLL circuit 100 is kept matched to the input signal $clk_{ref}$.

The PLL circuit 100 also keeps the frequency of the DCO output signal $clk_{dco}$ and the frequency of the input signal $clk_{ref}$ the same. The PLL circuit 100 may be implemented in a semiconductor integrated circuit and employed in various applications such as telecommunications, computers and other electronic fields. The PLL circuit 100 may be used to demodulate a signal, recover a signal from a noisy communication channel, generate a stable frequency at multiples of an input frequency (frequency synthesis), or distribute timed clock pulses in digital logic circuits such as microprocessors. The applications of the PLL circuit 100 described above are exemplary only and the PLL circuit 100 is not limited thereto in the present disclosure. Similar PLL circuits applied in other applications also fall within the contemplated scope of the present disclosure.

The PFD 102 is operative to detect a frequency difference and a phase difference between the two input signals $clk_{dco}$ and $clk_{ref}$ and produce the pair of signals UP and DN. In some embodiments, the frequency difference is determined based on a difference in counted number of rising edges of the DCO output signal $clk_{dco}$ in a cycle of the reference clock signal $clk_{ref}$ and a reference count in the cycle of the reference clock signal $clk_{ref}$. In some embodiments, the phase difference is determined based on relative arrivals of a rising edge of the DCO output signal $clk_{dco}$ and a rising edge of reference clock signal $clk_{ref}$. In some embodiments, the pair of signals UP and DN is produced based on sum of the frequency difference and phase difference. The pair of signals UP and DN tunes the frequency and/or phase of the DCO output signal $clk_{dco}$ to eliminate the frequency difference and/or the phase difference.

In an exemplary situation, the frequency difference is eliminated, and the PFD 102 produces the pair of signals UP and DN that indicates a sequence of arrivals of rising edges of the DCO output signal $clk_{dco}$ and the reference clock signal $clk_{ref}$ to represent the leading/lagging condition of the phase difference. The pair of signals UP and DN has a pulse width in positive correlation with a duration between the timing edges DCO output signal $clk_{dco}$ and the reference clock signal $clk_{ref}$ to represent the magnitude of the phase difference. The signal UP is embodied to represent that the phase of the DCO output signal $clk_{dco}$ lags the phase of the reference clock signal $clk_{ref}$. Conversely, the signal DN is embodied to represent that the phase of the DCO output signal $clk_{dco}$ leads the phase of the reference clock signal $clk_{ref}$. When the phase of the DCO output signal $clk_{dco}$ lags the phase of the reference clock signal $clk_{ref}$, a pulse width of the signal UP is in positive correlation with the phase difference between the DCO output signal $clk_{dco}$ and the reference clock signal $clk_{ref}$. When the phase of the DCO output signal $clk_{dco}$ leads the phase of the reference clock signal $clk_{ref}$, a pulse width of the signal DN is in positive correlation with the phase difference between the DCO output signal $clk_{dco}$ and the reference clock signal $clk_{ref}$.

The PLL circuit 100 with different structures for reducing the frequency difference and the phase difference are within the contemplated scope of the present disclosures. For example, in other embodiments to be described with reference to FIG. 13, the PFD 102 is replaced by a phase detector and another frequency loop is additionally employed in a PLL circuit 100e for reducing the frequency difference.

Figure 2:
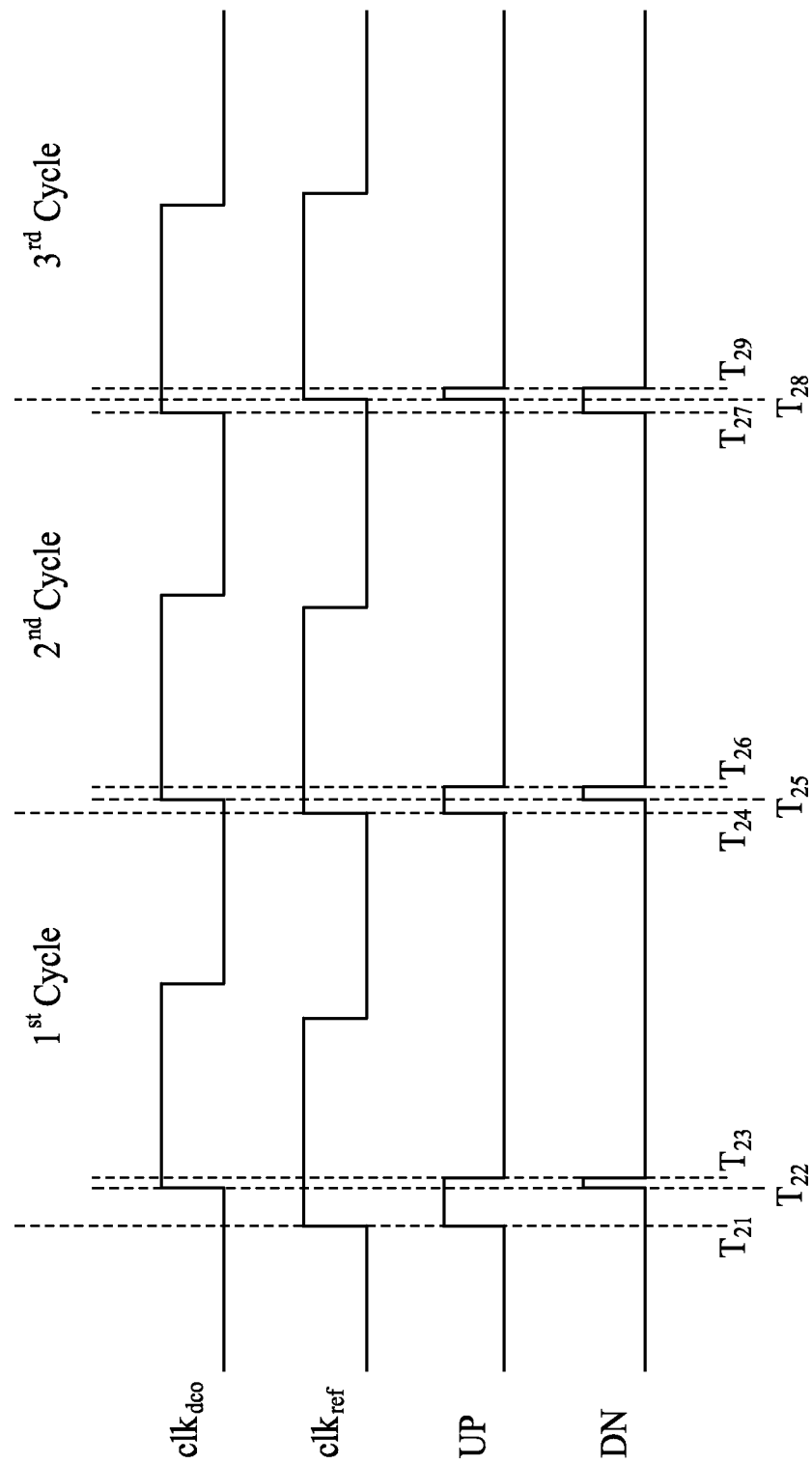
FIG. 2 is a timing diagram illustrating operations of a PFD according to one or more aspects of the present disclosure.

FIG. 2 is a timing diagram illustrating operations of the PFD 102 according to one or more aspects of the present disclosure. In the timing diagram shown in FIG. 2, it is assumed that the DCO output signal $clk_{dco}$ lags the reference clock signal $clk_{ref}$ at the first two cycles, and the DCO output signal $clk_{dco}$ leads the reference clock signal $clk_{ref}$ at the third cycle.

The PFD 102 is embodied to be rising edge triggered. For the first cycle, a rising edge of the reference clock signal $clk_{ref}$ at time $T_{21}$ causes the signal UP to be asserted a positive edge at time $T_{21}$. A rising edge of the DCO output signal $clk_{dco}$ at time $T_{22}$ causes the signal DN to be asserted with a positive edge at time $T_{22}$. The assertion of the signal UP earlier than that of the signal DN indicates the phase of the DCO output signal $clk_{dco}$ lags the reference clock signal $clk_{ref}$. A rising edge of DCO output clock signal $clk_{dco}$ at time $T_{22}$ and a reset delay of the PFD 102 cause the signal pulse UP to be deasserted with a negative edge at time $T_{23}$. A pulse width of the signal UP, a duration between $T_{21}$ and $T_{23}$, is in positive correlation with a duration between time $T_{21}$ and $T_{22}$ which is corresponding to the phase difference between the DCO output signal $clk_{dco}$ and the reference clock signal $clk_{ref}$. In some embodiments, the pulse width of the signal UP is longer than the duration between time $T_{21}$ and $T_{23}$ by a reset delay between time $T_{22}$ and $T_{23}$. The reset delay is known as a time period during which both signals UP and DN remain asserted, such as the time period between time $T_{22}$ and time $T_{23}$. The duration of the reset delay is determined according to design specification of the PFD 120, such as architectures and element delay.

Similarly, for the second cycle, a rising edge of the reference clock signal $clk_{ref}$ at time $T_{24}$ causes the signal UP to be asserted a positive edge at time $T_{24}$. A rising edge of the DCO output signal $clk_{dco}$ at time $T_{25}$ causes the signal DN to be asserted with a positive edge at time $T_{25}$. The assertion of the signal UP earlier than that of the signal DN indicates the phase of the DCO output signal $clk_{dco}$ lags the reference clock signal $clk_{ref}$. At the second cycle, the assertion time period of the signal UP is longer than the phase difference between the reference clock signal $clk_{ref}$ and the DCO output signal $clk_{dco}$ by a reset delay between time $T_{25}$ and time $T_{26}$. Compared to the pulse width of the signal UP in the first cycle, a pulse width of the signal UP in the second cycle, a duration between time $T_{24}$ and $T_{26}$, is shorter, indicating the phase difference between the DCO output signal $clk_{dco}$ and the reference clock signal $clk_{ref}$ is reduced.

Conversely, for the third cycle, a rising edge of the DCO output signal $clk_{dco}$ at time $T_{27}$ causes the signal DN to be asserted a positive edge at time $T_{27}$. A rising edge of the reference clock signal $clk_{ref}$ at time $T_{28}$ causes the signal UP to be asserted with a positive edge at time $T_{28}$. The assertion of the signal DN earlier than that of the signal UP indicates the phase of the DCO output signal $clk_{dco}$ leads the reference clock signal $clk_{ref}$. At the third cycle, the assertion time period of the signal UP is longer than the phase difference between the reference clock signal $clk_{ref}$ and the DCO output signal $clk_{dco}$ by a reset delay between time $T_{28}$ and time $T_{29}$.

Figure 3:
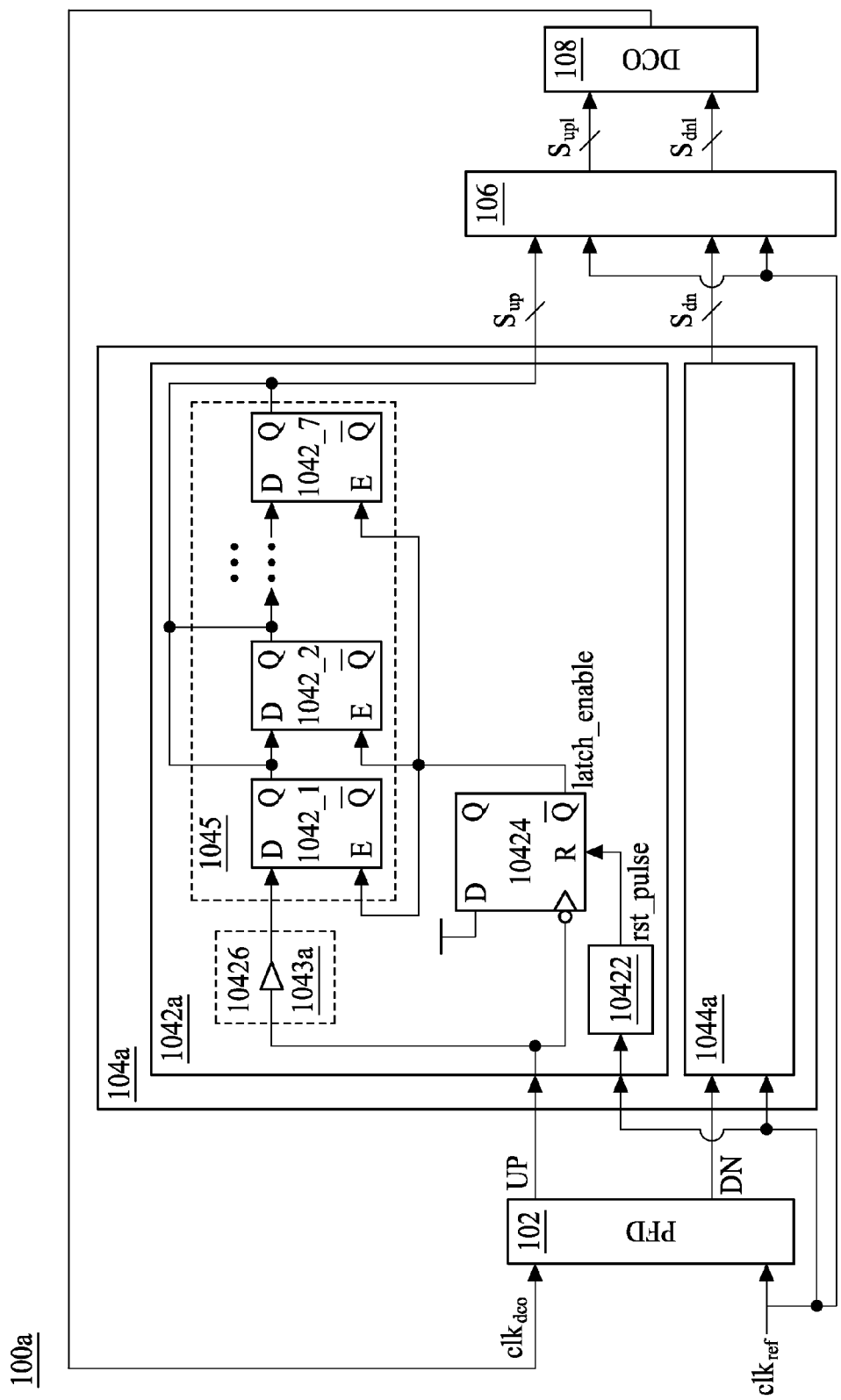
FIG. 3 is a diagram illustrating a PLL circuit with one implementation of the digitized phase difference generator according to one or more aspects of the present disclosure.
Figure 7:
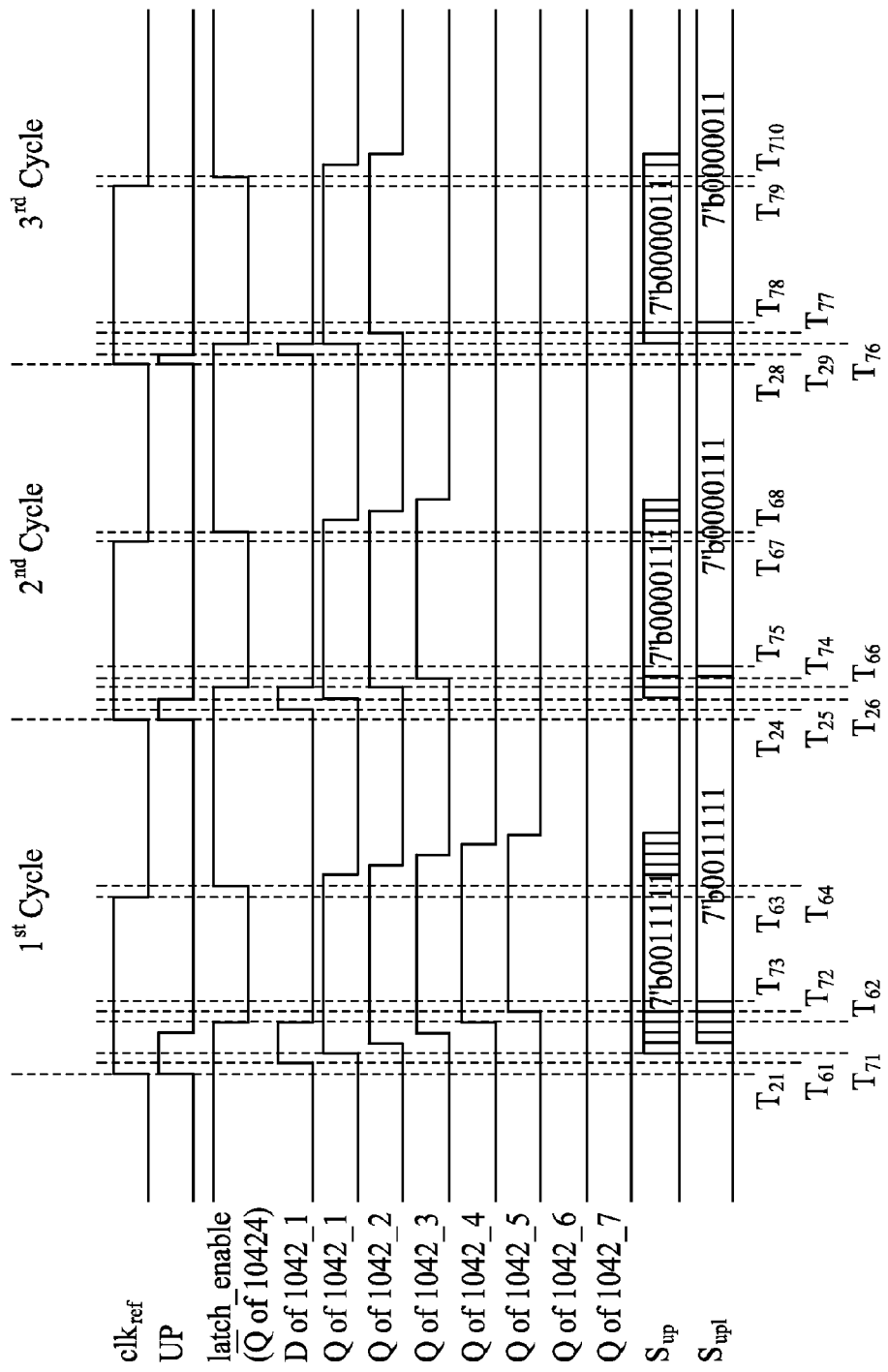
FIG. 7 is a timing diagram illustrating operations of a latch chain of a block and a latch stage according to one or more aspects of the present disclosure.

In some embodiments to be described with references to FIGS. 3 and 7, the reset delay is measured and subtracted off for determining the phase difference between the DCO output clock signal $clk_{dco}$ and the reference clock signal $clk_{ref}$. In other embodiments to be described with references to FIGS. 8 and 9, the reset delay is offset from being measured for determining the phase difference between the DCO output clock signal $clk_{dco}$ and the reference clock signal $clk_{ref}$.

PFDs with different structures are within the contemplated scope of the present disclosures. For example, the PFD 102 is falling edge triggered. For another example, the PFD 120 employs a reset delay-free architecture.

FIG. 3 is a diagram illustrating a PLL circuit 100a with one implementation of the digitized phase difference generator 104 according to one or more aspects of the present disclosure. A digitized phase difference generator 104a is one implementation of digitized phase difference generator 104 in FIG. 1. The digitized phase difference generator 104a includes two substantially identical blocks 1042a and 1044a respectively responsible for generating the digitized control code $S_{up}$ corresponding to the signal UP and generating the digitized control code $S_{dn}$ corresponding to the signal DN. Specifically, the block 1042a produces a thermometer code $S_{up}$ that represents the pulse width of the asserted signal UP in digital code, and the block 1044a produces a thermometer code $S_{dn}$ that represents the pulse width of the asserted signal DN in digital code. The PLL circuit 100a with digitized phase difference generator 104a producing other types of codes to represent the digitized phase differences are within the contemplated scope of the present disclosure. For example, in some embodiments to be described with reference to FIG. 10, the digitized phase difference generator 104c produce binary codes to represent the digitized phase differences.

In some embodiments, the block 1042a includes a reset unit 10422, a D-type flip flop 10424, a delay chain 1043a including a buffer 10426, and a latch chain 1045 delay chain the delay chain 1043a. The reset unit 10422 is operative to receive the reference clock signal $clk_{ref}$ and generate a reset pulse rst_pulse in response to a native edge of the reference clock signal $clk_{ref}$. The D-type flip flop 10424 is operative to receive the reset pulse rst_pulse at a reset input terminal R, the signal UP at a negative edge triggered clock input terminal, and a high reference voltage at a data input terminal D, and generate a latch enable signal latch_enable at an inverted output terminal $\overline{Q}$. Effectively, the signal latch_enable deasserts in response to a negative edge of the signal UP, and asserts in response to an arrival of the reset pulse rst_pulse. The delay chain 1043a delays the signal UP sent to the latch chain 1045 in correspondence with a delay in generating the signal latch_enable based on the signal UP. The latch chain 1045 is operative to receive the signal UP through the delay chain 1043a and the signal latch_enable, and generate the digitized control code $S_{up}$ that increases as the signal latch_enable enables the latch chain 1045 for propagating assertion of the signal UP and stops from increasing when the signal latch_enable disables the latch chain 1045 for propagation.

In the latch chain 1045, D-type latches 1042_1-1042_7 are serially cascaded. The D-type latches 1042_1 and 1042_7 respectively receive the signal latch_enable at the input terminals E and are commonly enabled/disabled for passing through data by the signal latch_enable. The D-type latch 1042_1 receives the signal UP through the delay chain 1043a. Outputs produced from terminals Q of the D-type latches 1042_1-1042_7 are bused together to form the thermometer control code $S_{up}$. In some embodiments, only a portion of outputs produced from terminals Q of the D-type latches 1042_1-1042_7 form(s) the control code $S_{up}$. In some embodiments, when the thermometer codes $S_{up}$ and $S_{dn}$ are further converted to binary codes, the number of the serially cascaded latches is configured to be $2^n-1$, wherein n is a positive integer. In this way, a representation capacity of the thermometer code $S_{up}$ or $S_{dn}$ corresponds to that of the binary code.

Figures 1, 4:
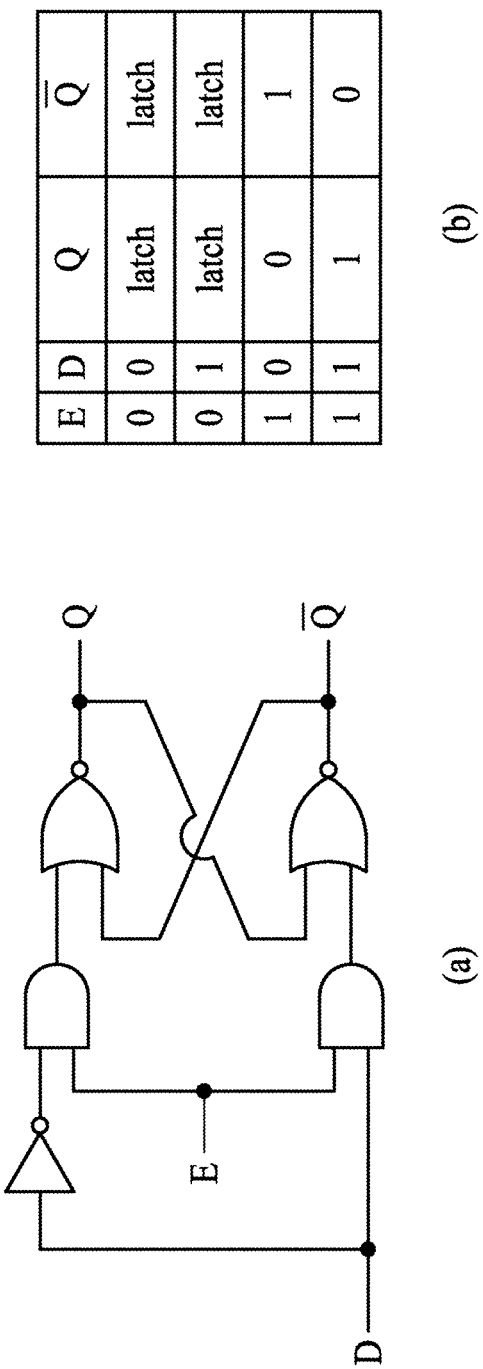
Figure 4:
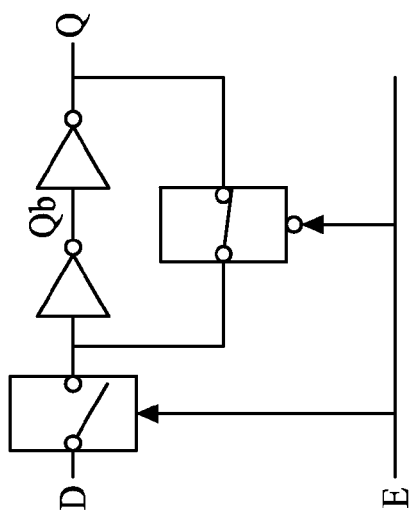
Figure 2:
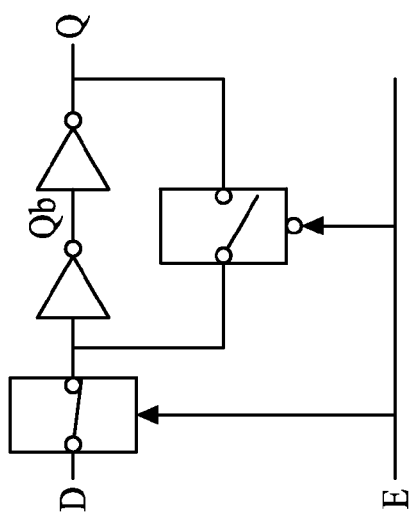

An internal logic and a truth table of the D-type latch such as the D-type latches 1042_1-1042_7 in FIG. 3 are shown respectively in FIGS. 4-1 (*a*) and (*b*) according to one or more aspects of the present disclosure. When the D-type latch is enabled, i.e. when a signal at an input terminal E is at a logical high state, nominally binary "1", the D-type latch propagates data at an input terminal D to an output terminal Q. A delay of the D-type latch referred to in some embodiments of the present disclosure is a delay for propagating the data from the input terminal D to the output terminal Q. When the D-type latch is disabled, i.e. when the signal at the input terminal E is at a logical low state, nominally binary "0", the D-type latch does not allow data at the input terminal D to propagate to the output terminal Q and provides, at the output terminal Q, data at the input terminal D latched in response to the high to low transition of the signal at the input terminal E. However, this is not a limitation of the disclosure.

An internal logic and a truth table of the D-type latch are shown in FIG. 4-2 according to other aspects of the present disclosure. As shown in FIG. 4-2 (*a*), when the D-type latch is enabled by asserting an input terminal E of the D-type latch from the logical low state to the logical high state, an output terminal Q will act in response to another input terminal D through two inverters therein. A delay of the D-type latch referred to in some embodiments of the present disclosure is a delay for propagating data from the input terminal D to the output terminal Q. Moreover, as shown in FIG. 4-2 (*b*), when the D-type latch is disabled by deasserting the input terminal E of the D-type latch from the logical high state to the logical low state, the two inverters and associated circuits form a closed loop to keep the previously latched value. The corresponding truth table is shown in FIG. 4-2 (*c*) which is substantially the same with FIG. 4-1 (*b*). In some embodiments, the latch is a gated SR latch. In some embodiments, the latch is selected from other types of latches.

Other types of latch 1042_1, . . . or 1042_7 or number of serially cascaded stages in the latch chain 1045 are within the contemplated scope of the present disclosure. In some embodiments, the type of latch 1042_1, . . . , or 1042_7 or number of stages of the serially cascaded latches 1042_1-1042_7 are determined based on a range of phase differences of the DCO output signal $clk_{dco}$ and reference clock signal $clk_{ref}$ to be covered by the PLL circuit 100. In some embodiments, the minimum phase difference is determined by the delay of each latch 1042_1, . . . or 1042_7. The type of the latches 1042_1-1042_7 are chosen such that the PLL circuit 100 matches the phases of the DCO output signal $clk_{dco}$ and the reference clock signal $clk_{ref}$ with a specified resolution. Given the type of the latches 1042_1-1042_7, the maximum phase difference is determined by the number of stages of the latch chain 1045. The number of stages in the latch chain 1045 is determined such that such that the PLL circuit 100 achieves frequency and phase locking for normal cases in a specified time.

Figure 5:
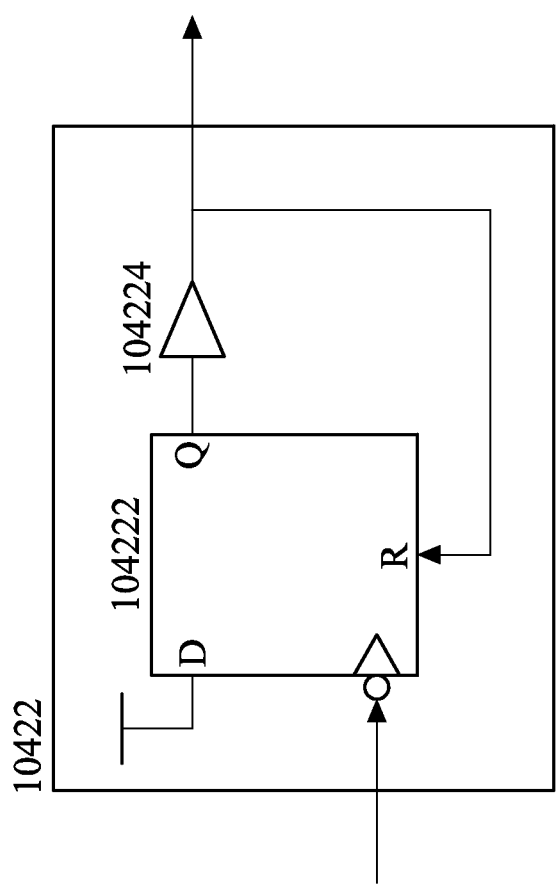
FIG. 5 is a diagram illustrating a reset unit according to one or more aspects of the present disclosure.

FIG. 5 is a diagram illustrating the reset unit 10422 according to one or more aspects of the present disclosure. The reset unit 10422 includes a D-type flip flop 104222 and a delay buffer 104224. The D-type flip flop 104222 is triggered by a negative edge of the reference clock signal $clk_{ref}$. The reset pulse rst_pulse produced by the reset unit 10422 has a width determined by a delay time of the delay buffer 104224. The latch stage 106 described with reference to FIG. 1 include latches similar to those described with references to FIGS. 4-1 and 4-2 to latch control codes $S_{up}$ and $S_{dn}$ in response to the reference clock signal $clk_{ref}$. Each latch in the latch stage 106 receives a bit of the control codes $S_{up}$ and $S_{dn}$ at the input terminal D and the reference clock signal $clk_{ref}$ at the input terminal E.

Figure 6:
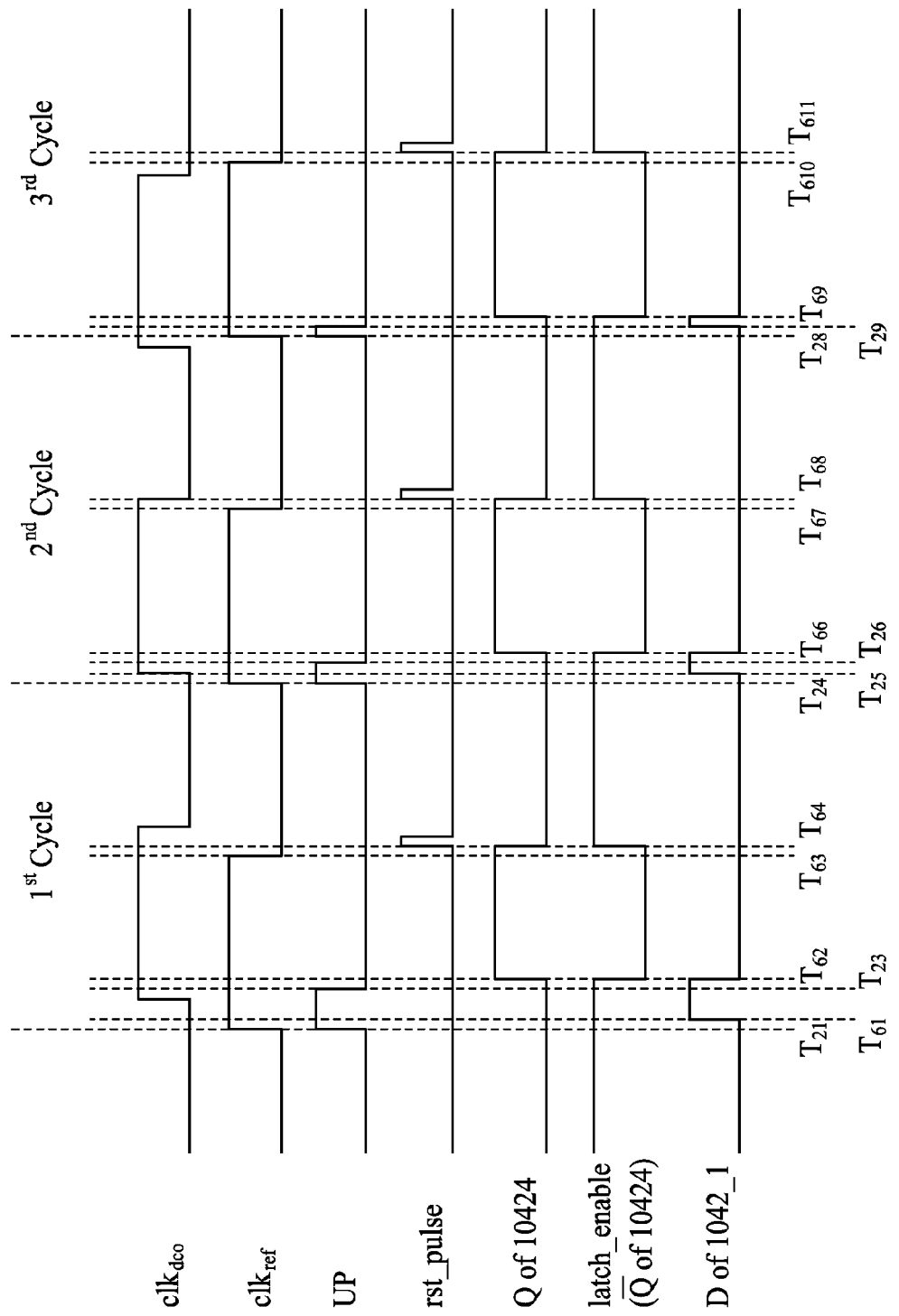
FIG. 6 is a timing diagram illustrating operations of the reset unit, the D-type flip flop and the delay chain according to one or more aspects of the present disclosure.

FIG. 6 is a timing diagram illustrating operations of the reset unit 10422, the D-type flip flop 10424 and the delay chain 1043a of the block 1042 according to one or more aspects of the present disclosure. Corresponding to FIG. 2, in the first cycle and the second cycle, the DCO output signal $clk_{dco}$ lags the reference clock signal $clk_{ref}$ and in the third cycle, the DCO output signal $clk_{dco}$ leads the reference clock signal $clk_{ref}$. In the first two cycles, pulses of the signal UP are generated to have pulse widths in positive correlation with to the phase differences of the DCO output signal $clk_{dco}$ and the reference clock signal $clk_{ref}$. In the third cycle, a pulse of the signal UP is generated to have a pulse width reflecting the reset delay. Before a starting edge of a pulse width of the signal UP arrives, the signal latch_enable generated by the D-type flip flop 10424 enables the latch chain 1045 for data propagation. In response to an ending edge of the pulse width of the signal UP, the signal latch_enable disables the latch chain 1045 for data propagation. An increase in the measured pulse width of the pulse of the signal UP due to a delay of the D-type flip flop 10424 is offset by the delay chain 1043a that delays the signal UP to arrive at the latch chain 1045. The reset pulse is generated by the reset unit 10422 to cause the signal latch_enable to be enabled for measuring the next pulse width of the signal UP.

For the first cycle, the signal UP is asserted at time $T_{21}$ and deasserted at time $T_{23}$. Effectively, a starting edge of a pulse of the signal UP occurs at time $T_{21}$ and an ending edge of the pulse of the signal UP occurs at time $T_{23}$. At time $T_{61}$, a signal at the output terminal Q of the D-type flip flop 10424 has been in a low state, and a signal at the inverse output terminal $\overline{Q}$ of the D-type flip flop 10424 which is also the signal latch_enable has been in a high state. The latch chain 1045 is enabled for data propagation for measuring a pulse width of the signal UP. In response to the falling edge of the signal UP at time $T_{23}$, the D-type flip flop 10424 deasserts the signal latch_enable at time $T_{62}$, which disables the latch chain 1045 for data propagation. A delay time between the time $T_{23}$ and time $T_{62}$ equals to about the propagation delay time of the D-type flip flop 10424. Such delay time is offset by delaying the assertion of the signal UP at time $T_{21}$ to arrive at the input terminal D of the latch 1042_1 at time $T_{61}$ using the delay chain 1043a. In response to a falling edge of the reference clock signal clk$_{ref}$ at time T$_{63}$, the reset unit 10422 asserts the reset pulse rst_pulse at time T$_{64}$. In response to the assertion of the reset pulse rst_pulse at time T$_{64}$, the D-type flip flop 10424 asserts the signal latch_enable at time T$_{64}$ which enables the latch chain 1045 for data propagation for the second cycle.

For the second cycle, the signal UP is asserted at time T$_{24}$ and deasserted at time T$_{26}$. Effectively, a starting edge of a pulse of the signal UP occurs at time T$_{24}$ and an ending edge of the pulse of the signal UP occurs at time T$_{26}$. At time T$_{24}$, a signal at the output terminal Q of the D-type flip flop 10424 has been in a low state, and a signal at the inverse output terminal $\overline{Q}$ of the D-type flip flop 10424 which is also the signal latch_enable has been in a high state. The latch chain 1045 is enabled for data propagation for measuring a pulse width of the signal UP. In response to the falling edge of the signal UP at time T$_{26}$, the D-type flip flop 10424 deasserts the signal latch_enable at time T$_{66}$, which disables the latch chain 1045 for data propagation. A delay time between the time T$_{26}$ and time T$_{66}$ equals to about the propagation delay time of the D-type flip flop 10424. Such delay time is offset by delaying the assertion of the signal UP at time T$_{24}$ to arrive at the input terminal D of the latch 1042_1 at time T$_{25}$ using the delay chain 1043$a$. In response to a falling edge of the reference clock signal clk$_{ref}$ at time T$_{67}$, the reset unit 10422 asserts the reset pulse rst_pulse at time T$_{68}$. In response to the assertion of the reset pulse rst_pulse at time T$_{68}$, the D-type flip flop 10424 asserts the signal latch_enable at time T$_{68}$ which enables the latch chain 1045 for data propagation for the third cycle.

For the third cycle, the signal UP is asserted at time T$_{28}$ and deasserted at time T$_{29}$. Effectively, a starting edge of a pulse of the signal UP occurs at time T$_{28}$ and an ending edge of the pulse of the signal UP occurs at time T$_{29}$. At time T$_{28}$, a signal at the output terminal Q of the D-type flip flop 10424 has been in a low state, and a signal at the inverse output terminal $\overline{Q}$ of the D-type flip flop 10424 which is also the signal latch_enable has been in a high state. The latch chain 1045 is enabled for data propagation for measuring a pulse width of the signal UP. In response to the falling edge of the signal UP at time T$_{29}$, the D-type flip flop 10424 deasserts the signal latch_enable at time T$_{69}$, which disables the latch chain 1045 for data propagation. A delay time between the time T$_{29}$ and time T$_{69}$ equals to about the propagation delay time of the D-type flip flop 10424. Such delay time is offset by delaying the assertion of the signal UP at time T$_{28}$ to arrive at the input terminal D of the latch 1042_1 at time T$_{28}$ using the delay chain 1043$a$. In response to a falling edge of the reference clock signal clk$_{ref}$ at time T$_{610}$, the reset unit 10422 asserts the reset pulse rst_pulse at time T$_{611}$. In response to the assertion of the reset pulse rst_pulse at time T$_{611}$, the D-type flip flop 10424 asserts the signal latch_enable at time T$_{611}$ which enables the latch chain 1045 for data propagation for the following cycle.

In the embodiments in FIG. 3, the delay chain 1045 is further used to balance the timing between input terminals D and E of the D-type latch 1042_1 since the path from the output of the PFD 102 to the input terminal E of the D-type latch 1042_1 has an additional delay time caused by the D-type flip flop 10424. In other words, it is more accurate in measuring the pulse width of the signal UP for the architecture to employ the delay chain 1043$a$ having about the same delay time of the D-type flip flop 10424 to balance the two timing paths. Please note that this is not a limitation of the disclosure. In some embodiments, the delay chain 1043$a$ is implemented by other delay elements. In some embodiments, the delay chain 1043$a$ is omitted.

FIG. 7 is a timing diagram illustrating operations of the latch chain 1045 of the block 1042$a$ and the latch stage 106 according to one or more aspects of the present disclosure. Corresponding to FIG. 6, the pulse widths of the signal UP are reduced from the first cycle to the third cycle, and for each cycle, the signal latch_enable is enabled before the starting edge of the pulse width of the signal UP and disabled in response to the ending edge of the pulse width of the signal UP. When the signal latch_enable enables the latch chain 1045 for data propagation, the arrival of the starting edge of the pulse width of the signal UP at the input terminal D of the latch 1042_1 is propagated along the serially cascaded latches 1042_1-1042_7 described with reference to FIG. 3 until the signal latch_enable disables the latch chain 1045 for data propagation. Subsequently, the control code S$_{up}$ is available at the output terminals Q of the latches 1042_1-1042_7. The control code S$_{up}$ increased in correspondence with the pulse width of the signal UP is therefore a digitized representation of the pulse width of the signal UP. The latch stage 106 latches the control code S$_{up}$ in response to the reference clock signal clk$_{ref}$ so that the control code S$_{up1}$ is still available after the signal latch_enable is enabled. The latch stage 106 provides a larger margin for additional digital signal processing circuits between the digitized phase difference generator 104 and the DCO 108, such as a smoothing circuit and/or a proportional-integral-derivative (PID) controller, as will be described with reference to FIG. 12.

For the first cycle, an arrival of a rising edge at the input terminal D of the latch 1042_1 at time T$_{61}$ is propagated to the output terminal Q of the latch 1042_1 which is coupled to the input terminal D of the latch 1042_2 at time T$_{71}$. The latency of each of the latches 1042_1-1042_7 is substantially identical to each other. Similar to the latch 1042_1, the rising edge is propagated by the latches 1042_2, 1042_3, 1042_4 and 1042_5. At time T$_{62}$, the signal latch_enable disables the latch chain 1045 for data propagation. In addition, at time T$_{62}$, the rising edge arrives at the input terminal D of the latch 1042_5 coupled to the output terminal Q of the latch 1042_4. At time T$_{72}$, the rising edge is propagated to the output terminal Q of the latch 1042_5. The rising edge is not propagated by the latches 1042_6 and 1042_7 because the latch chain 1045 is disabled. The output terminals Q of the latches 1042_1-1042_7 are combined in an order from Q of the latch 1042_7, Q of the latch 1042_6, Q of the latch 1042_5, Q of the latch 1042_4, Q of the latch 1042_3, Q of the latch 1042_2, to Q of the latch 1042_1 to form the control code S$_{up}$. The control code S$_{up}$ which is a thermometer code with a value 7'b0011111 is valid starting at time T$_{72}$. The control code S$_{up}$ is propagated to outputs of the latch stage 106 as the control code S$_{up1}$ at time T$_{73}$. At time T$_{63}$, in response to the falling edge of the reference clock signal clk$_{ref}$, the latch stage 106 latches the control code S$_{up}$. At time T$_{64}$, the signal latch_enable enables the latch chain 1045 for data propagation for the second cycle.

For the second cycle, an arrival of a rising edge at the input terminal D of the latch 1042_1 at time T$_{25}$ is propagated to the output terminal Q of the latch 1042_1 which is coupled to the input terminal D of the latch 1042_2 at time T$_{26}$. The latency of each of the latches 1042_1-1042_7 is substantially identical to each other. Similar to the latch 1042_1, the rising edge is propagated by the latches 1042_2 and 1042_3. At time T$_{66}$, the signal latch_enable disables the latch chain 1045 for data propagation. In addition, at time T$_{66}$, the rising edge arrives at the input terminal D of the latch 1042_3 coupled to the output terminal Q of the latch 1042_2. At time T$_{74}$, the rising edge is propagated to the output terminal Q of the latch 1042_3. The rising edge is not propagated by the latches 1042_4, 1042_5, 1042_6 and 1042_7 because the latch chain 1045 is disabled. The output terminals Q of the latches 1042_1-1042_7 are combined in an order from Q of the latch 1042_7, Q of the latch 1042_6, Q of the latch 1042_5, Q of the latch 1042_4, Q of the latch 1042_3, Q of the latch 1042_2, to Q of the latch 1042_1 to form the control code $S_{up}$. The control code $S_{up}$ which is a thermometer code with a value 7'b0000111 is valid starting at time $T_{74}$. The control code $S_{up}$ is propagated to outputs of the latch stage 106 as the control code $S_{up1}$ at time $T_{75}$. At time $T_{67}$, in response to the falling edge of the reference clock signal $clk_{ref}$, the latch stage 106 latches the control code $S_{up}$. At time $T_{68}$, the signal latch_enable enables the latch chain 1045 for data propagation for the third cycle.

For the third cycle, an arrival of a rising edge at the input terminal D of the latch 1042_1 at time $T_{29}$ is propagated to the output terminal Q of the latch 1042_1 which is coupled to the input terminal D of the latch 1042_2 at time $T_{76}$. The latency of each of the latches 1042_1-1042_7 is substantially identical to each other. Similar to the latch 1042_1, the rising edge is propagated by the latch 1042_2. At time $T_{76}$, the signal latch_enable disables the latch chain 1045 for data propagation. In addition, at time $T_{76}$, the rising edge arrives at the input terminal D of the latch 1042_2 coupled to the output terminal Q of the latch 1042_1. The rising edge is not propagated by the latches 1042_3, 1042_4, 1042_5, 1042_6 and 1042_7 because the latch chain 1045 is disabled. The output terminals Q of the latches 1042_1-1042_7 are combined in an order from Q of the latch 1042_7, Q of the latch 1042_6, Q of the latch 1042_5, Q of the latch 1042_4, Q of the latch 1042_3, Q of the latch 1042_2, to Q of the latch 1042_1 to form the control code $S_{up}$. The control code $S_{up}$ which is a thermometer code with a value 7'b0000011 is valid starting at time $T_{77}$. The control code $S_{up}$ is propagated to outputs of the latch stage 106 as the control code $S_{up1}$ at time $T_{78}$. At time $T_{79}$, in response to the falling edge of the reference clock signal $clk_{ref}$, the latch stage 106 latches the control code $S_{up}$. At time $T_{710}$, the signal latch_enable enables the latch chain 1045 for data propagation for the following cycle.

In some embodiments, to subtract the reset delay of the PFD 102 from the pulse width of the signal UP obtained, for example, in the first cycle, a pulse width of the signal DN in the first cycle shown in FIG. 2 is also obtained. Similarly, to subtract the reset delay of the PFD 102 from the pulse width of the signal DN obtained in the third cycle shown in FIG. 2, the pulse width of the signal UP in the third cycle is obtained, as described above. In some embodiments, the DCO 108 performs the subtraction of the control code $S_{dn1}$ or $S_{up1}$ from the control code $S_{up}$ or $S_{dn}$. In other embodiments, another block (not shown in FIG. 1) preceding the DCO 108 performs the subtraction.

For each of the first cycle, second cycle and third cycle in FIG. 7, the control code $S_{up}$ is valid before the latch stage 106 latches the control code $S_{up}$ in response to the falling edge of the reference clock signal $clk_{ref}$. In addition, the signal latch_enable enables the latch chain 1045 for data propagation in response to the falling edge of the reference clock signal $clk_{ref}$ for the following cycle. Therefore, a latency of the digitized phase difference generator 104 described with reference to FIG. 3 is within a positive duty of a cycle of the reference clock signal $clk_{ref}$, or half a cycle of the reference clock signal $clk_{ref}$. In some embodiments, the latency of the digitized phase difference generator 104 includes a latency of the delay chain 1043a and the latch chain 1045. Specifically, the latency of the digitized phase difference generator 104 is measured from a rising edge of the reference clock signal $clk_{ref}$ to a rising edge of the signal UP being propagated to the output terminal Q of the last stage such as the latch 1042_7 in the latch chain 1045. In some embodiments, the DCO 108 is a digitized oscillator circuit that generates an analog signal, whose frequency and phase is controlled by the digital control code $S_{up1}$ and $S_{dn1}$ fed to the DCO 108. In some embodiments, the DCO 108 is a combination of a voltage-controlled oscillator and a digital-to-analog converter, wherein the voltage-controlled oscillator is driven by a control signal converted from the digital control code $S_{up1}$ and $S_{dn1}$ by the digital-to-analog converter. Other implementations of the DCO 108 are within the contemplated scope of the present disclosure. For example, the DCO 108 includes serially cascaded delay stages that can be switched on or off in accordance with the digital control code $S_{up1}$ and $S_{dn1}$.

In the embodiments described with references to FIGS. 1 to 7, the number of stages and the delay of each stage of the latch chain 1045 are controlled such that a latency of the digitized phase difference generator 104 is less than half a cycle of the reference clock signal $clk_{ref}$, and the disclosed architecture is capable of measuring a specified range of phase differences produced from the PFD 102. As the number of stages in the latch chain 1045 is controlled, the power consumption and hardware cost are reduced. Further, by controlling the latency of the digitized phase difference generator 104, timing for other existing blocks such as the PFD 102 and the DCO 108 or timing for inserting additional blocks such as the smoothing circuit to be described with reference to FIG. 12 in the closed loop is relaxed, thereby allowing further optimization of the PLL circuit 100.

Configuration for not Measuring Reset Delay

Figure 8:
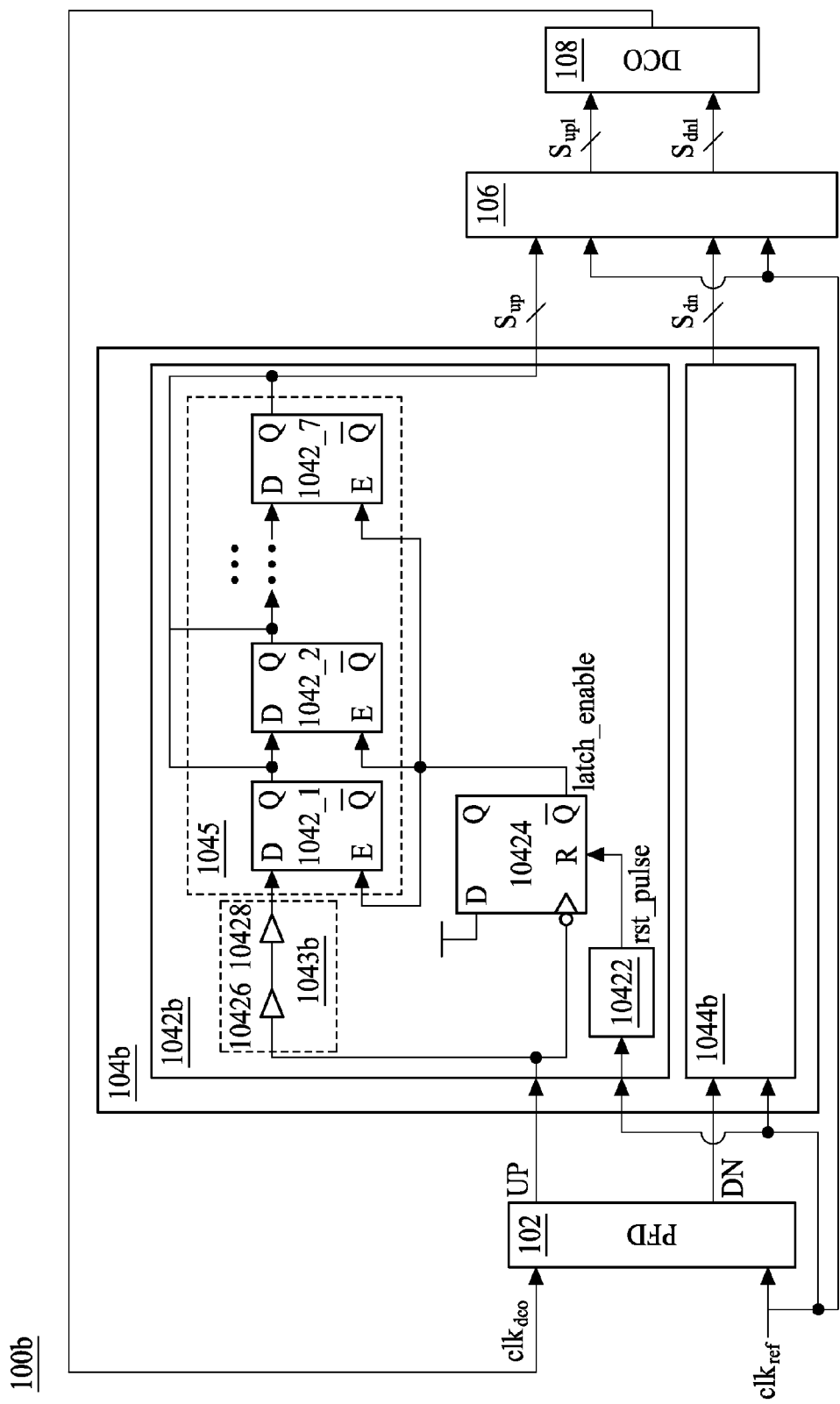
FIG. 8 is a diagram illustrating a PLL circuit with another implementation of the digitized phase difference generator according to one or more aspects of the present disclosure.

FIG. 8 is a diagram illustrating a PLL circuit 100b with another implementation of the digitized phase difference generator 104 according to one or more aspects of the present disclosure. A digitized phase difference generator 104b is one implementation of digitized phase difference generator 104 in FIG. 1. The digitized phase difference generator 104b includes a block 1042b and a block 1044b. Compared to the digitized differences generator 104a in FIG. 3, a delay chain 1043b of the digitized differences generator 104b includes another buffer 10428 so that the reset delay described with reference to FIG. 2 is offset from being measured for determining the phase difference between the DCO output clock signal $clk_{dco}$ and the reference clock signal $clk_{ref}$. In some embodiments, a delay time of the buffer 10428 is substantially the same as the reset delay of the signals UP and DN.

Figure 9:
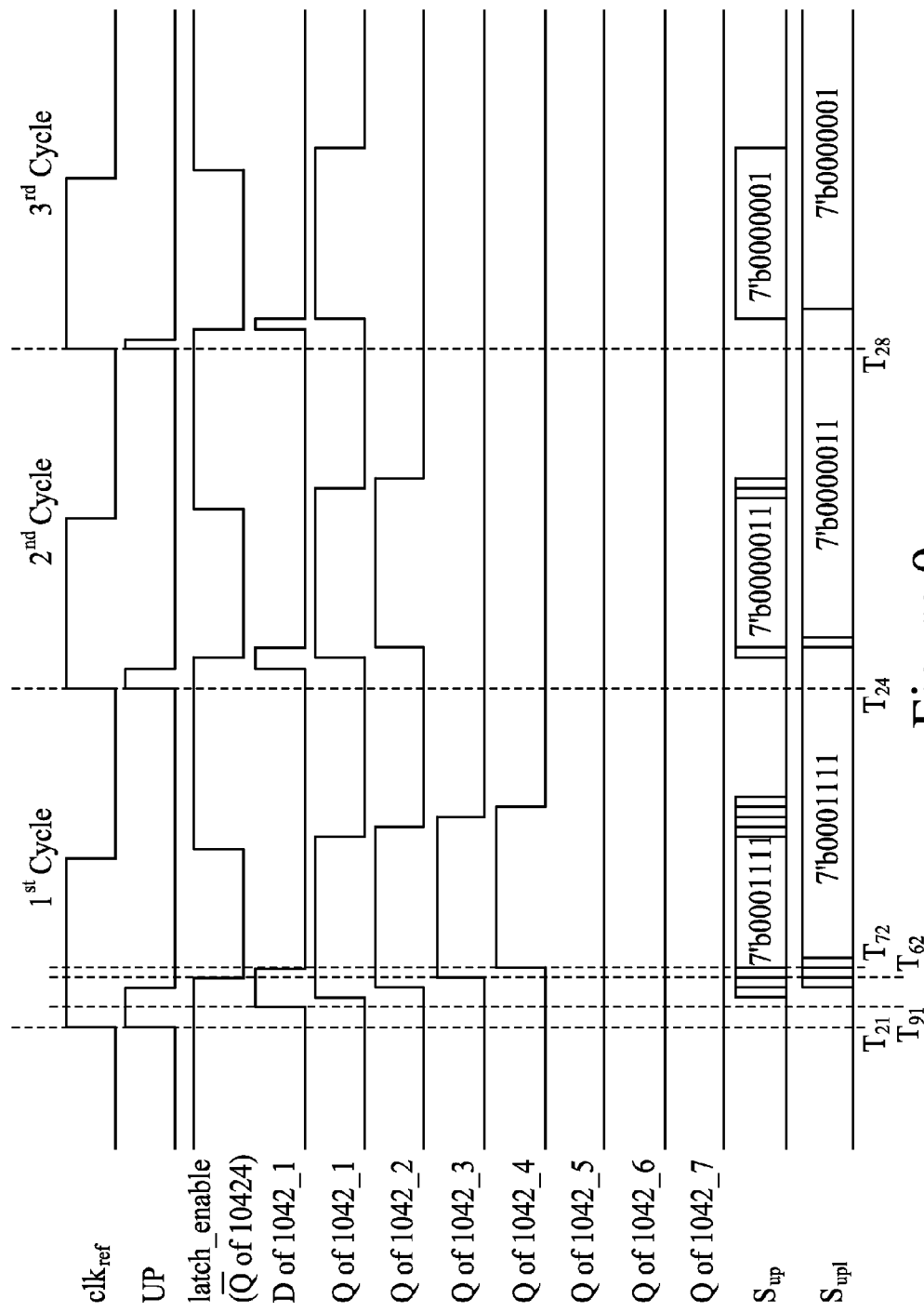
FIG. 9 is a timing diagram illustrating operations of a block of FIG. 8 according to one or more aspects of the present disclosure.

FIG. 9 is a timing diagram illustrating operations of the block 1042b according to one or more aspects of the present disclosure. Compared to the timing diagram in FIG. 7, the rising edge of the signal UP at time T21 arrives at the input terminal D of the latch 1042_1 at time $T_{91}$ after time $T_{61}$ in FIG. 7 due to the additional buffer 10428. At time $T_{62}$ the same as in FIG. 7, the signal latch_enable disables the latch chain for data propagation. Because of the delayed arrival of the rising edge of the signal UP and the undelayed signal latch_enable compared to those in FIG. 7, the rising edge is only propagated to the output terminal Q of the latch 1042_4. As a result, the control code $S_{up}$ of FIG. 9 has a value of 7'b0001111, which is smaller than the control code $S_{up}$ 7'b0011111 of FIG. 7 by one bit. By offsetting the time when the pulse width of the signal UP is started to be measured by the reset delay, one bit in the control code $S_{up}$ for representing the reset delay in the pulse width of the signal UP is released, thereby increasing representation capacity of the control code $S_{up}$.

Configuration for Control Code Conversion

Figure 10:
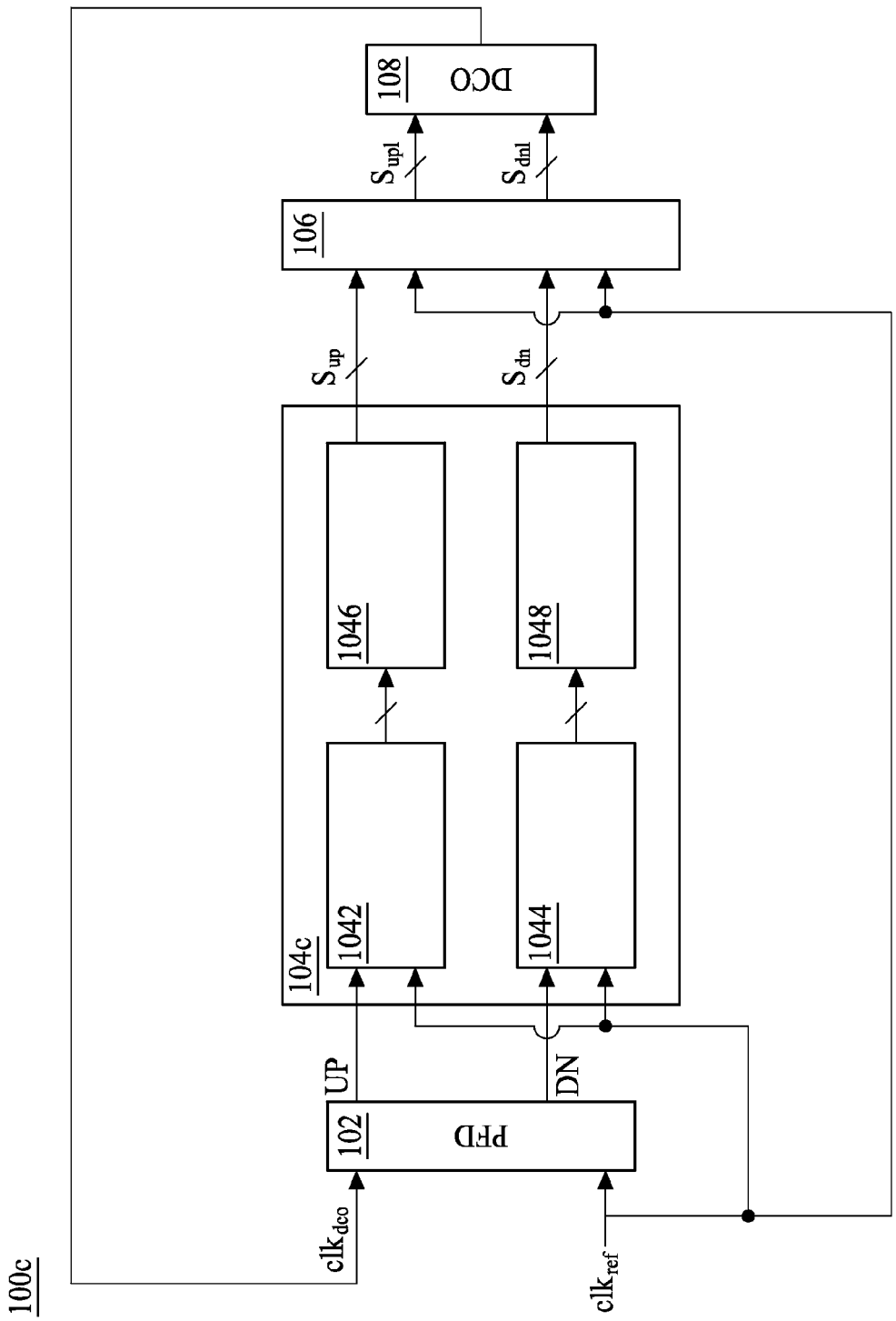
FIG. 10 is diagram illustrating a PLL circuit according to other aspects of the present disclosure.

FIG. 10 is a diagram illustrating a PLL circuit 100c according to other aspects of the present disclosure. Compared to the PLL circuit 100a in FIG. 1, the PLL circuit 100c further includes thermometer code to binary code converters 1046 and 1048. The thermometer code to binary code converter 1046 is coupled between the output of the block 1042 and the input of the latch stage 106 receiving the control code $S_{up}$. The thermometer code to binary code converter 1048 is coupled between the output of the block 1044 and the input of the latch stage 106 receiving the control code $S_{dn}$. FIG. 11 is an exemplary conversion table of thermometer code to the binary code used by the converters 1046 and 1048 in FIG. 10. In some embodiments, to covert the thermometer code to the binary code, the thermometer code is first converted into one-hot code using equation (1):

$$b_i = a_i \overline{a_{i+1}} \quad (1)$$

where a is the thermometer code, b is the one hot code and i is the $i^{th}$ bit. Then the one-hot code is converted into the binary code using a flat tree encoder based on a set of equations (2):

$$c_0 = b_0 + b_2 + b_4 + b_6$$
$$c_1 = b_1 + b_2 + b_5 + b_6$$
$$c_2 = b_3 + b_4 + b_5 + b_6 \quad (2)$$

where b is the one hot code, c is the binary code, and the subscripts are the bit positions.

Other conversion methods are within the contemplated scope of the present disclosure. For example, the one-hot code is converted into the binary code using a ROM-based encoder. Other formats for representing the control codes are within the contemplated scope of the present disclosure. A code other than the binary code, e.g., a gray code, is employed as an input data format of the DCO 108.

Configuration for Loop Filtering

Figure 12:
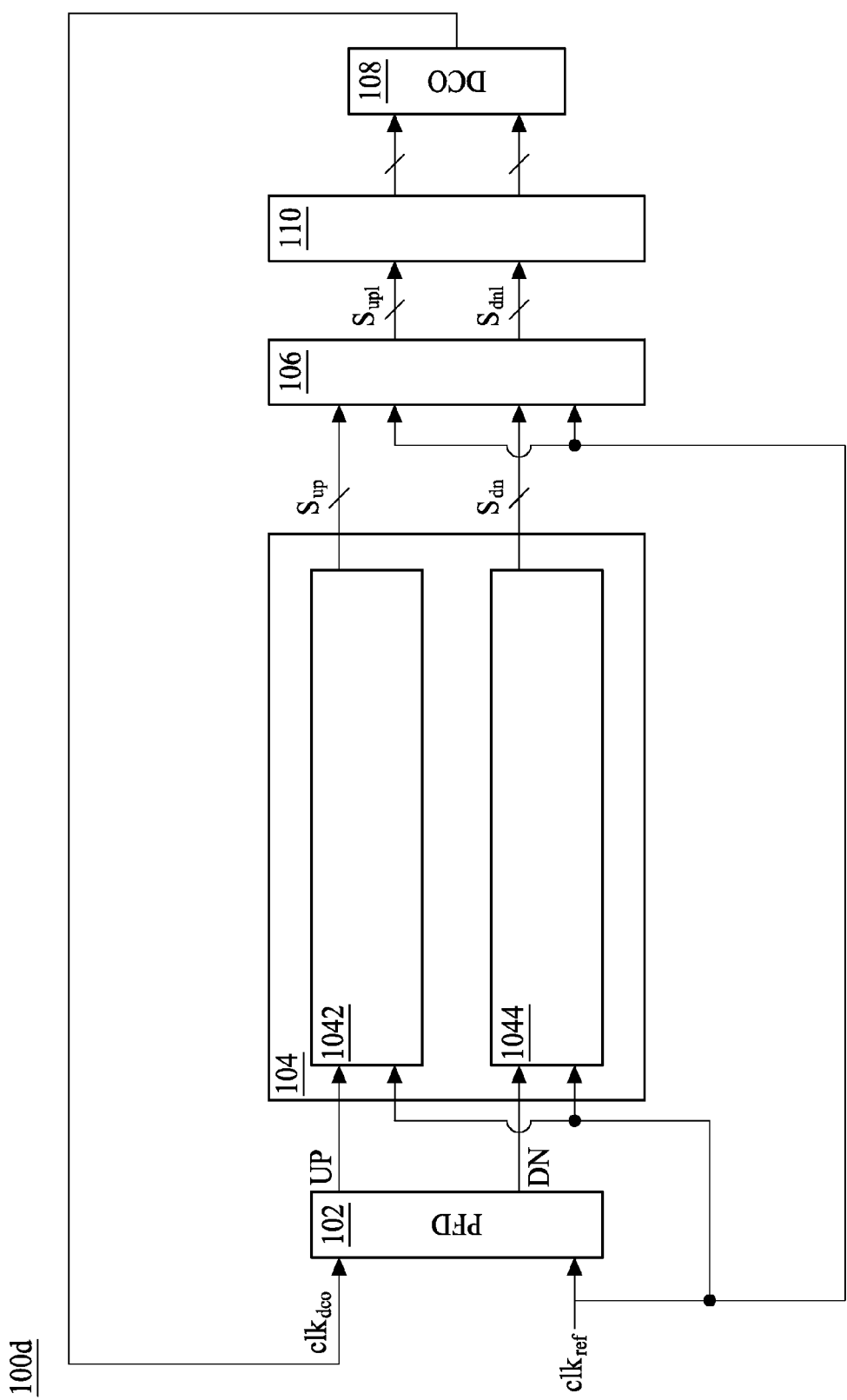
FIG. 12 is a diagram illustrating the PLL circuit according to still other aspects of the present disclosure.

FIG. 12 is a diagram illustrating a PLL circuit 100d according to still other aspects of the present disclosure. Compared to the PLL circuit 100a in FIG. 1, the PLL circuit 100d further includes a loop filter 110 coupled between the latch stage 106 and the DCO 108. The loop filter 110 is operative to receive the control codes $S_{up1}$ and $S_{dn1}$, and generate adjusted control codes. In some embodiments, the loop filter 110 includes a proportional-integral (PI) controller. A proportion path in the PI controller multiplies the control codes $S_{up1}$ and $S_{dn1}$ with a proportional gain. An integral path in the PI controller integrates the control codes $S_{up1}$ and $S_{dn1}$ for a time period and multiples the integrated result with an integral gain. The results of the proportion path and the integral path are summed to produce the adjusted control codes to the DCO 108. When a phase error determined based on sum of the frequency difference and the phase difference between the DCO output signal $clk_{dco}$ and the reference clock signal $clk_{ref}$ is larger than a threshold, the loop filter 110 is controlled to only enable the proportion path. By disabling the integral path and increase the proportional gain, a faster lock time and a wider loop-bandwidth are achieved in an earlier stage for matching the frequencies and phases of the DCO output signal $clk_{dco}$ and the reference clock signal $clk_{ref}$. When the phase error between the DCO output signal $clk_{dco}$ is smaller than the threshold, the loop filter 110 is controlled to have both the proportion path and the integral path. By adding the integral path and decreasing the proportional gain, a smaller loop-bandwidth and higher capability in eliminating the phase error in a later stage for matching the frequencies and phases of the DCO output signal $clk_{dco}$ and the reference clock signal $clk_{ref}$. In some embodiments, the integral gain is tuned to further facilitate eliminating the phase error.

Other implementations of the loop filter are within the contemplated scope of the present disclosure. For example, the loop filter 110 further includes a smoothing circuit coupled between the latch stage 105 and the PI controller. In some embodiments, the smoothing circuit includes a low pass filter which attenuates spurious such as that caused by quantization during digitization and phase noise at higher frequencies such as that caused by a crystal oscillator generating the reference clock signal $clk_{ref}$. For another example, the loop filter 110 includes a PID controller. Compared to the PI controller, the PID controller further includes a derivative path. In some embodiments, the derivative path obtains a rate of change of the control codes $S_{up1}$ and $S_{dn1}$ and multiplies the rate of change with a derivative gain. The results of the proportion path, integral path and derivative path are summed to produce the adjusted control codes to DCO 108. In some embodiments, by adding the derivative path, stability of the PLL circuit 100d is improved.

In some embodiments, the loop filter 110 completes a job of an instant cycle during a negative duty of the reference clock signal $clk_{ref}$. In the embodiment, the total latency of the digitized phase difference generator 104, latch stage 106 and the loop filter 110 is within one cycle of the reference clock signal $clk_{ref}$, and thus a small loop delay is achieved. The small loop delay improves stability of the closed loop.

Different Configuration for Initial Frequency Pull-In

Figure 13:
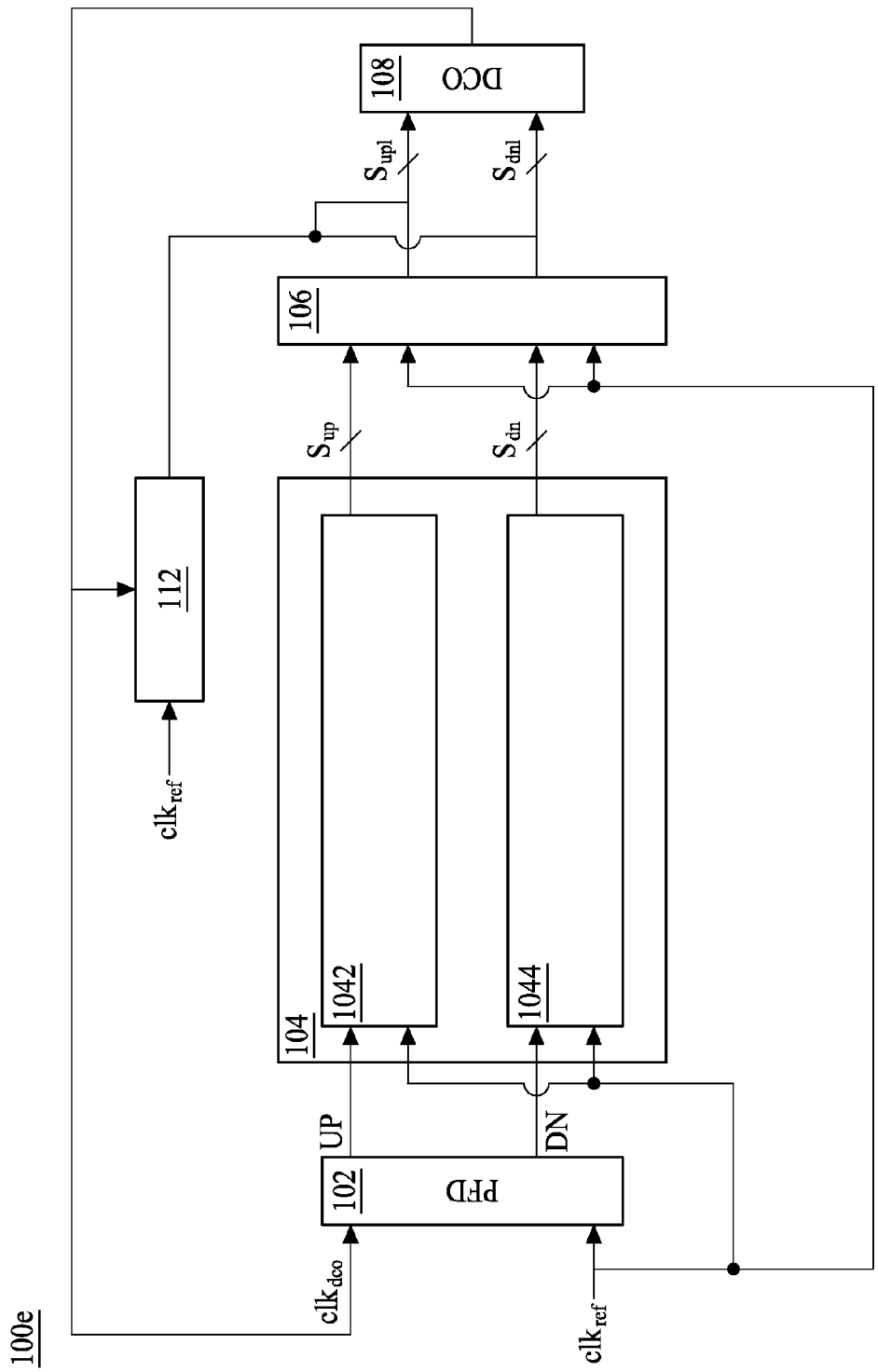
FIG. 13 is a diagram illustrating the PLL circuit according to still other aspects of the present disclosure.

FIG. 13 is a diagram illustrating a PLL circuit 100e according to still other aspects of the present disclosure. Compared to the PLL circuit 100a in FIG. 1, the PLL circuit 100e further includes a frequency detector 112 that is coupled between the input and output of the DCO 108 and forms another auxiliary closed loop in addition to the main loop (i.e., the loop passing through the digitized phase difference generator 104). In some embodiments, the frequency detector 112 is operative to receive the DCO output signal $clk_{dco}$ and the reference clock signal $clk_{ref}$, detect a frequency difference between the DCO output signal $clk_{dco}$ and the reference clock signal $clk_{ref}$, and generate control codes $S_{up1}$ and $S_{dn1}$ input to the DCO 108. The frequency detector 112 is capable of achieving initial frequency pull-in in a relative short amount of time compared to the PFD 102 due to different resolutions of control codes representing the frequency difference. In addition, the capability of the frequency detector 112 in pulling in a larger capture range reduces any chances that the main loop to slip out of the capture range such as when dramatic temperature change induces deteriorated jitter performance. In some embodiments, the frequency detector 112 is activated at an initial stage of the lock or when the PLL circuit 100e slips out of the capture range. In some embodiments, the frequency detector 112 is deactivated once the main loop becomes stable.

Different Configuration for Frequency Synthesizer

Figure 14:
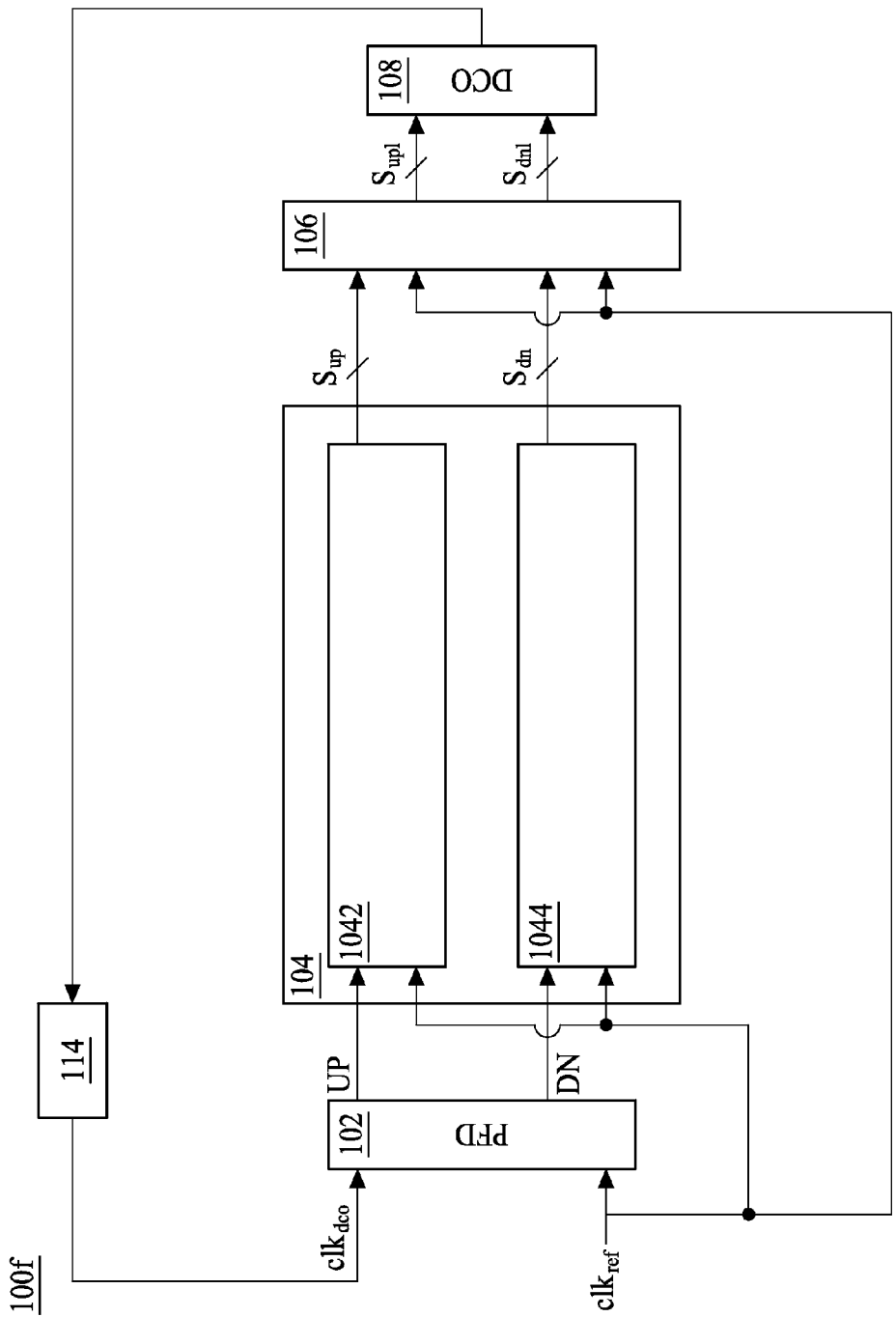
FIG. 14 is a diagram illustrating the PLL circuit according to still other aspects of the present disclosure.

FIG. 14 is a diagram illustrating a PLL circuit 100*f* according to still other aspects of the present disclosure. In some embodiments, the PLL circuit 100*f* serves as a frequency synthesizer. Compared to the PLL circuit 100*a* in FIG. 1, the PLL circuit 100*f* further includes a frequency divider 114, also called a clock divider, added between the DCO 108 and the PFD 102. The frequency divider is operative to receive the output signal from the DCO 108, divide a frequency of the output signal with a divisor and generate the feedback input signal to the PFD 102. By matching the divided frequency of the output signal from the DCO 108 and the frequency of the reference clock signal $clk_{ref}$, the DCO 108 produces the output signal with a frequency equal to the frequency of the reference clock signal $clk_{ref}$ multiplied by the divisor. In some embodiments, the divisor of the frequency divider 114 is programmable, thereby allowing the PLL circuit 100*f* to synthesize different frequencies.

Some embodiments of the present disclosure provide a phase-locked loop (PLL) circuit. The PLL circuit includes a detecting circuit configured to detect a phase difference between a digitally controlled oscillator (DCO) clock signal and a reference clock signal, and generate a phase difference signal based on the detected phase difference; a digitized difference generator, coupled to the detecting circuit, configured to generate a control code based upon the difference signal; and a DCO configured to generate the DCO output signal responsive to the control code of the digitized difference generator; wherein the detecting circuit, the digitized difference generator and the DCO form a closed loop and reduce the phase difference between the DCO output signal and the reference clock signal.

In some embodiments of the present disclosure, a latency caused by the digitized difference generator is less than a duty of a cycle of the reference clock signal.

In some embodiments of the present disclosure, the difference signal includes a signal UP and a signal DN, when the DCO output signal lags the reference clock signal, the signal UP is used to reflect the phase difference, and when the DCO output signal leads the reference clock signal, the signal DN is used to reflect the phase difference.

In some embodiments of the present disclosure, the digitized difference generator includes an UP latch chain and a DN latch chain, the UP latch chain propagates a starting edge of a first pulse of the signal UP until the UP latch chain is disabled in response to an ending edge of the first pulse, the DN latch chain propagates a starting edge of a second pulse of the signal DN until the DN latch chain is disabled in response to an ending edge of the second pulse, and outputs of latches of the UP latch chain and outputs of latches of the DN latch chain form the control code.

In some embodiments of the present disclosure, a latency caused by the UP latch chain is less than a duty of a cycle of the reference clock signal; and a latency caused by the DN latch chain is less than the duty of the cycle of the reference clock signal.

In some embodiments of the present disclosure, the digitized difference generator further includes an UP delay chain coupled to the UP latch chain, and a DN delay chain coupled to the DN latch chain.

In some embodiments of the present disclosure, a latency caused by the UP delay chain and a latency caused by the DN delay chain are determined based on a reset delay during which the signal UP and the signal DN are both asserted.

In some embodiments of the present disclosure, the UP latch chain holds an UP thermometer code when the UP latch chain is disabled, and the DN latch chain holds a DN thermometer code when the DN latch chain is disabled.

In some embodiments of the present disclosure, the digitized difference generator further includes an UP code converter configured to convert the UP thermometer code to an UP binary code, and a DN code converter configured to convert the DN thermometer code to a DN binary code.

In some embodiments of the present disclosure, the UP latch chain and the DN latch chain are reset in response to ending of a duty of a cycle of the reference clock signal.

In some embodiments of the present disclosure, the PLL circuit further includes a latch stage coupled between the digitized difference generator and the DCO, wherein the control code is maintained in the latch stage when the latch stage is disabled in response to ending of a duty of a cycle of the reference clock signal.

In some embodiments of the present disclosure, the PLL circuit further includes a loop filter coupled between the digitized difference generator and the DCO, wherein the loop filter includes a smoothing circuit configured to smooth the control code generated by the digitized phase difference generator.

In some embodiments of the present disclosure, the loop filter includes a proportional-integral-derivative (PID) controller.

In some embodiments of the present disclosure, the PLL circuit further includes a frequency detector configured to detect a frequency difference between the DCO output signal and the reference clock signal and cause the DCO to adjust the DCO output signal to reduce the frequency difference between the DCO output signal and the reference clock signal.

In some embodiments of the present disclosure, the PLL circuit further includes a frequency divider coupled between the DCO and the detecting circuit.

Some embodiments of the present disclosure provide a method. The method includes: detecting a phase difference between a DCO output signal and a reference clock signal, and generating a difference signal based on the detected phase difference; generating a control code based upon the difference signal; and generating the DCO output signal responsive to the control code, wherein the control code causes the DCO output signal to be adjusted to reduce the phase difference between the DCO output signal and the reference clock signal.

In some embodiments of the present disclosure, a latency caused by generating the control code based upon the difference signal is less than a duty of a cycle of the reference clock signal.

In some embodiments of the present disclosure, generating the control code based upon the difference signal includes propagating a starting edge of a first pulse of the difference signal through a latch chain until the latch chain is disabled in response to an ending edge of the first pulse, and a latency caused by the latch chain is less than a duty of a cycle of the reference clock signal.

In some embodiments of the present disclosure, the latch chain holds a thermometer code, and generating the control code based upon the difference signal further includes converting the thermometer code to a binary code.

Some embodiments of the present disclosure provide a circuit. The circuit includes a detecting circuit configured to detect a phase difference between a first clock signal and a second clock signal, and generate a difference signal based on the detected phase difference; and a digitized difference generator, coupled to the detecting circuit, configured to generate a control code based upon the difference signal.

In some embodiments of the present disclosure, a latency caused by the digitized difference generator is less than a duty of a cycle of the second clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-locked loop (PLL) circuit, comprising:
    a detecting circuit configured to detect a phase difference between a digitally controlled oscillator (DCO) output signal and a reference clock signal, and generate a difference signal based on the detected phase difference;
    a digitized difference generator, coupled to the detecting circuit, configured to generate a control code based upon the difference signal; and
    a DCO configured to generate the DCO output signal responsive to the control code of the digitized difference generator;
    wherein the detecting circuit, the digitized difference generator and the DCO form a closed loop and reduce the phase difference between the DCO output signal and the reference clock signal;
    wherein the difference signal comprises a signal UP and a signal DN, when the DCO output signal lags the reference clock signal, the signal UP is used to reflect the phase difference, and when the DCO output signal leads the reference clock signal, the signal DN is used to reflect the phase difference;
    wherein the digitized difference generator comprises an UP latch chain and a DN latch chain, the UP latch chain propagates a starting edge of a first pulse of the signal UP until the UP latch chain is disabled in response to an ending edge of the first pulse, the DN latch chain propagates a starting edge of a second pulse of the signal DN until the DN latch chain is disabled in response to an ending edge of the second pulse, and outputs of latches of the UP latch chain and outputs of latches of the DN latch chain form the control code.

2. The PLL circuit of claim 1, wherein a latency caused by the digitized difference generator is less than a duty of a cycle of the reference clock signal.

3. The PLL circuit of claim 1, wherein a latency caused by the UP latch chain is less than a duty of a cycle of the reference clock signal, and a latency caused by the DN latch chain is less than the duty of the cycle of the reference clock signal.

4. The PLL circuit of claim 1, wherein the digitized difference generator further comprises an UP delay chain coupled to the UP latch chain, and a DN delay chain coupled to the DN latch chain.

5. The PLL circuit of claim 4, wherein a latency caused by the UP delay chain and a latency caused by the DN delay chain are determined based on a reset delay during which the signal UP and the signal DN are both asserted.

6. The PLL circuit of claim 1, wherein the UP latch chain holds an UP thermometer code when the UP latch chain is disabled, and the DN latch chain holds a DN thermometer code when the DN latch chain is disabled.

7. The PLL circuit of claim 6, wherein the digitized difference generator further comprises an UP code converter configured to convert the UP thermometer code to an UP binary code, and a DN code converter configured to convert the DN thermometer code to a DN binary code.

8. The PLL circuit of claim 1, wherein the UP latch chain and the DN latch chain are reset in response to ending of a duty of a cycle of the reference clock signal.

9. The PLL circuit of claim 1, further comprising a latch stage coupled between the digitized difference generator and the DCO, wherein the control code is maintained in the latch stage when the latch stage is disabled in response to ending of a duty of a cycle of the reference clock signal.

10. The PLL circuit of claim 9, wherein the loop filter includes a proportional-integral-derivative (PID) controller.

11. The PLL circuit of claim 1, further comprising a loop filter coupled between the digitized difference generator and the DCO, wherein the loop filter includes a smoothing circuit configured to smooth the control code generated by the digitized phase difference generator.

12. The PLL circuit of claim 1, further comprising a frequency detector configured to detect a frequency difference between the DCO output signal and the reference clock signal and cause the DCO to adjust the DCO output signal to reduce the frequency difference between the DCO output signal and the reference clock signal.

13. The PLL circuit of claim 1, further comprising a frequency divider coupled between the DCO and the detecting circuit.

14. A method, comprising:
    detecting a phase difference between a DCO output signal and a reference clock signal, and generating a difference signal based on the detected phase difference;
    generating a control code based upon the difference signal; and
    generating the DCO output signal responsive to the control code,
    wherein the control code causes the DCO output signal to be adjusted to reduce the phase difference between the DCO output signal and the reference clock signal;
    wherein generating the control code based upon the difference signal comprises propagating a starting edge of a first pulse of the difference signal through a latch chain until the latch chain is disabled in response to an ending edge of the first pulse.

15. The method of claim 14, wherein a latency caused by generating the control code based upon the difference signal is less than a duty of a cycle of the reference clock signal.

16. The method of claim 14, wherein a latency caused by the latch chain is less than a duty of a cycle of the reference clock signal.

17. The method of claim 14, wherein the latch chain holds a thermometer code, and generating the control code based upon the difference signal further comprises converting the thermometer code to a binary code.

18. A circuit, comprising:
a detecting circuit configured to detect a phase difference between a first clock signal and a second clock signal, and generate a difference signal based on the detected phase difference; and
a digitized difference generator, coupled to the detecting circuit, configured to generate a control code based upon the difference signal;
wherein the difference signal comprises a signal UP and a signal DN, when the first clock signal lags the second clock signal, the signal UP is used to reflect the phase difference, and when the first clock signal leads the second clock signal, the signal DN is used to reflect the phase difference;
wherein the digitized difference generator comprises an UP latch chain and a DN latch chain, the UP latch chain propagates a starting edge of a first pulse of the signal UP until the UP latch chain is disabled in response to an ending edge of the first pulse, the DN latch chain propagates a starting edge of a second pulse of the signal DN until the DN latch chain is disabled in response to an ending edge of the second pulse, and outputs of latches of the UP latch chain and outputs of latches of the DN latch chain form the control code.

19. The circuit of claim 18, wherein a latency caused by the digitized difference generator is less than a duty of a cycle of the second clock signal.

\* \* \* \* \*